United States Patent [19]

Hirai et al.

[11] Patent Number: 4,831,721

[45] Date of Patent: May 23, 1989

[54] MOUNTING HEAD EXCHANGE ARRANGEMENT FOR PART MOUNTING MACHINE

[75] Inventors: Wataru Hirai, Hirakata; Koji Fujiwara, Yamatokoriyama, both of Japan

[73] Assignee: Matsushita Electric Industrial Co., Ltd., Osaka, Japan

[21] Appl. No.: 70,823

[22] Filed: Jul. 6, 1987

[30] Foreign Application Priority Data

Jul. 4, 1986 [JP] Japan .................................. 61-158152
Jul. 9, 1986 [JP] Japan .................................. 61-161348

[51] Int. Cl.4 ............................................. B23P 19/04
[52] U.S. Cl. ......................................... 29/740; 29/568; 29/33 K; 901/40; 414/912
[58] Field of Search ............... 29/568, 33 K, 739, 740, 29/741; 901/37, 40; 414/912

[56] References Cited

U.S. PATENT DOCUMENTS

| | | | |
|---|---|---|---|
| 4,145,802 | 3/1979 | d'Auria | 29/568 |
| 4,486,928 | 12/1984 | Tucker et al. | 29/568 |
| 4,611,397 | 9/1986 | Janisiewicz et al. | 29/740 |

Primary Examiner—P. W. Echols
Attorney, Agent, or Firm—Wenderoth, Lind & Ponack

[57] ABSTRACT

A mounting head exchange apparatus for a part mounting machine includes a moving unit as a part mounting portion for mounting parts onto a circuit board and the like, head holding portions, and a plurality of mounting heads provided at the head holding portions. Each of the mounting heads has a suction nozzle for attracting parts, and sets of position regulating claws for effecting positioning of the attracted parts. The mounting heads provided at the holding portions are so arranged that a predetermined mounting head is selected from them and detachably mounted to the moving unit. Thus, the mounting heads each provided with the position regulating claws and the suction nozzle may be exchanged as one unit.

13 Claims, 7 Drawing Sheets

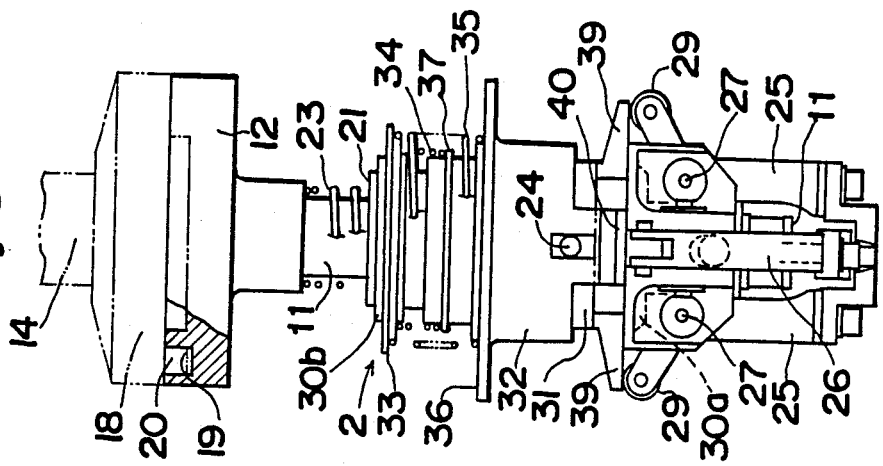
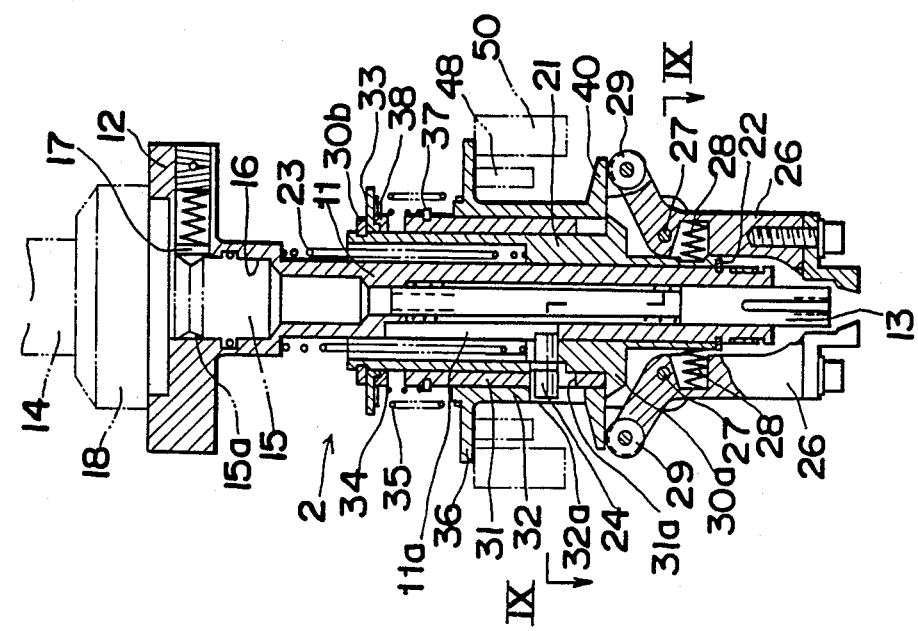

MOUNTING HEAD EXCHANGE ARRANGEMENT FOR PART MOUNTING MACHINE

BACKGROUND OF THE INVENTION

The present invention generally relates to a part mounting or attaching machine for mounting, for example, electronic parts or components onto an electronic circuit board or the like, and more particularly, to an exchange arrangement for mounting heads each having position regulating claws for regulating positions of parts attracted by a suction nozzle thereof, for use in the part mounting machine.

Conventionally, there have been proposed various part mounting machines for mounting electronic parts onto an electronic circuit board or the like, in which a mounting head is displaceably provided between a part supply portion and the circuit board so as to attract the electronic part by a suction or attraction nozzle provided on said mounting head for mounting said part onto a predetermined position on the circuit board. Similarly, for improved accuracy at the part mounting position, there is disclosed in Japanese Patent Laid-Open Application Tokkaisho No. 55-37283, an arrangement adapted to regulate positional deviation of an attracted part with respect to an axis of a suction nozzle by position regulating claws.

Meanwhile, there are cases where exchanging of suction nozzles or mounting heads is required depending on sizes of parts to be attracted, kinds of parts to be dealt with, or nature of work involved, etc., and Japanese Patent laid-Open Application Tokkaisho No. 59-69992 discloses an exchange arrangement for automatically effecting such exchanging, in which a plurality of straight tools such as suction nozzles or the like are supported by a holder, and the necessary tool is selectively picked out from the holder, by fitting a holding member at the side of the mounting head main body, into the upper end portion of said tool for subsequent raising of the holding member.

However, by the exchange arrangement as described above intended to exchange only the suction nozzles, transfer of the parts in a state where they are accurately regulated for position has been very difficult, and it is desirable to arrange mounting heads each having a suction nozzle and position regulating claws corresponding to the part configurations, to be exchangeable, but, in that case, there has been involved such a problem that, due to the mechanism, etc. required for opening and closing of the position regulating claws, construction of the mounting head itself, and that of the holder and function thereof are extremely complicated. In other words, if the conventional unexchangeable mounting head provided with the suction nozzles and position regulating claws were assumed to be altered into an exchangeable one, with its construction being maintained as it is, then the construction of the mounting head and that of the holder would be extremely complicated. Applicants know of no prior art device corresponding to such a postulated device.

SUMMARY OF THE INVENTION

Accordingly, an essential object of the present invention is to provide a mounting head exchange arrangement for a part mounting machine, which is relatively simple in construction, and capable of exchanging mounting heads each having position regulating claws and a suction nozzle, as one unit.

Another important object of the present invention is to provide mounting heads each having construction suitable for use with the mounting head exchange arrangement as referred to above.

In accomplishing these and other objects, according to a first aspect of the present invention, there is provided a mounting head exchange arrangement for a part mounting machine, which includes a moving unit as a part mounting portion for mounting parts onto a circuit board and the like, head holding portions, and a plurality of mounting heads provided at the head holding portions. Each of the mounting heads has a suction nozzle for attracting parts thereto, and sets of position regulating claws for effecting positioning of the attracted parts, and the mounting heads provided at the holding portions are so arranged that a predetermined mounting head is selected therefrom and detachably mounted to the moving unit.

Meanwhile, in a second aspect of the present invention, there is provided a mounting head exchange arrangement for a part mounting machine, which includes a support shaft provided in a moving unit as a part mounting portion of the part mounting machine and having a fitting portion formed at its lower end, a plurality of mounting heads each formed, at its upper end, with a fixing hole into which the fitting portion of the support shaft is fitted for engagement, and including sets of position regulating claws adapted to be selectively opened or closed for positioning of parts attracted by a suction nozzle provided at its lower portion, and a plurality of holding means arranged in a parallel relation, and each having a holding portion for releasably holding a support flange formed on each of the mounting heads from its side portion.

Furthermore, in a third aspect of the present invention, there is provided a mounting head exchange apparatus for a part mounting machine, which includes a support shaft provided in a moving unit as a part mounting portion of the part mounting machine and having a fitting portion formed at its lower end, a plurality of mounting heads each formed, at its upper end, with a fixing hole into which the fitting portion of the support shaft is fitted for engagement, and including sets of position regulating claws adapted to be selectively opened or closed for positioning of parts attracted by a suction nozzle provided at its lower portion and a function flange axially and resiliently displaceable so as to selectively open or close the position regulating claws for positioning of parts attracted by a suction nozzle provided at its lower portion, and a plurality of holding means arranged in a parallel relation, and each having a holding portion for releasably holding a support flange formed on each of the mounting head from its side portion, and also for supporting the function flange in a state where compression reaction is applied between the support flange and the function flange.

According to the first aspect of the present invention as described above, by the construction to mount the desired mounting head as selected from the plurality of mounting heads provided at the holding portion, onto the moving unit or part mounting portion, the mounting heads each having the position regulating claws and suction nozzle may be exchanged as one unit.

In the second aspect of the present invention, after bringing the support shaft mounted with the mounting head to be exchanged, into a position to confront the side portion of the empty holding means, the support shaft and the holding means are relatively moved to locate the holding portion immediately below the support shaft, and with the support flange of the mounting head being supported by the holding portion, the support shaft is raised to be drawn out of the fixing hole, whereby the mounting head is held by the holding means. Subsequently, the holding means and the support shaft are relatively moved to be spaced from each other, while the support shaft is positioned to confront the side of the holding means holding the mounting head to be mounted, and after bringing the holding portion of the holding means immediately below the support shaft, the support shaft is lowered for engagement with the fixing hole, and then, by causing the support flange to leave the holding portion through relative spacing between the holding means and the support shaft, the mounting head is mounted on the support shaft, thereby to complete the exchange of the mounting heads.

According to the second aspect of the present invention as described above, since it is only required to provide, in plurality, the holding means having the holding portion for releasably holding the support flange formed on the mounting head from the side portion, the construction is simplified, while the support shaft at the side for mounting the head is only required to effect the movement, and rising or lowering functions in the similar manner as in the part mounting for the exchange of the mounting heads. Therefore, in spite of the simple construction, the mounting heads may be exchanged through an extremely simple operation without requiring any particular functions therefor.

Meanwhile, by the third aspect of the present invention, the mounting head may be positively held by the compression reaction applied between the support flange and function flange, and moreover, the rising and lowering functions of the support shaft can be utilized for exerting the holding force. Therefore, the construction is also simplified, without requiring any operating members, driving source, etc. at the side of the holding means for consequent reduction in cost.

Furthermore, in another aspect of the present invention, as a mounting head having construction suitable for use with the mounting head exchange arrangement as described above, there is provided a mounting head which includes a support cylindrical member through which a hollow shaft provided with the suction nozzle at its lower end is axially displaceably inserted, a first sleeve slidably fitted over the outer periphery of the support cylindrical member and a second sleeve also slidably fitted over the first sleeve, with two sets of the position regulating claws adapted to be selectively opened or closed in association with the sliding movements of the sleeves being movably attached to the support cylindrical member for opening and closing so that both of the sleeves are slid simultaneously through engagement of the second sleeve with the first sleeve after sliding movement of said second sleeve by a predetermined amount.

By the mounting head according to the present invention as described above, since the pair of position regulating claws are first opened or closed by the displacement of the second sleeve, and upon further displacement of the second sleeve, the first sleeve is also displaced so as to open or close another pair of position regulating claws, there is no possibility that a part held by the head is undesirably fixed in a posture where it is inclined. Moreover, since the position regulating claws are adapted to be opened or closed in association with the sleeves, the open/close mechanism is simple in construction and thus, accurate position regulation may be readily achieved. Moreover, only the dual sleeves are required for the operating portion, the overall construction is simple to provide a mounting head in a compact size at low cost.

BRIEF DESCRIPTION OF THE DRAWINGS

These and other objects and features of the present invention will become apparent from the following description taken in conjunction with the preferred embodiment thereof with reference to the accompanying drawings, in which;

FIG. 7 is a vertical sectional view of a mounting head employed in the mounting head exchange arrangement of FIG. 1, FIG. 8 is a side elevational view of the mounting head of FIG. 7.

DETAILED DESCRIPTION OF THE INVENTION

Figure 1:
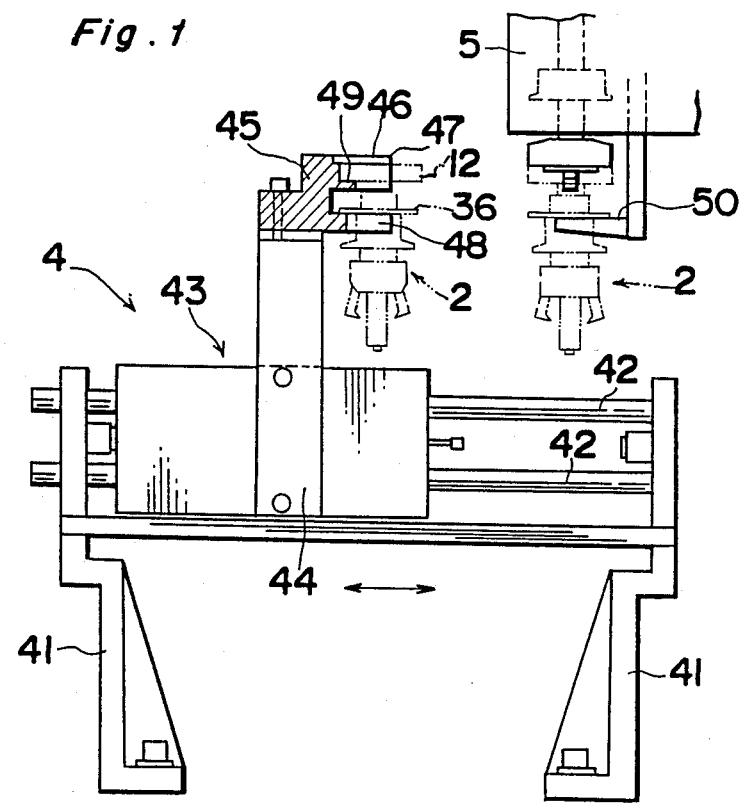
FIG. 1 is a front elevational view, partly in section, of a mounting head exchange apparatus according to one preferred embodiment of the present invention.
Figure 2:
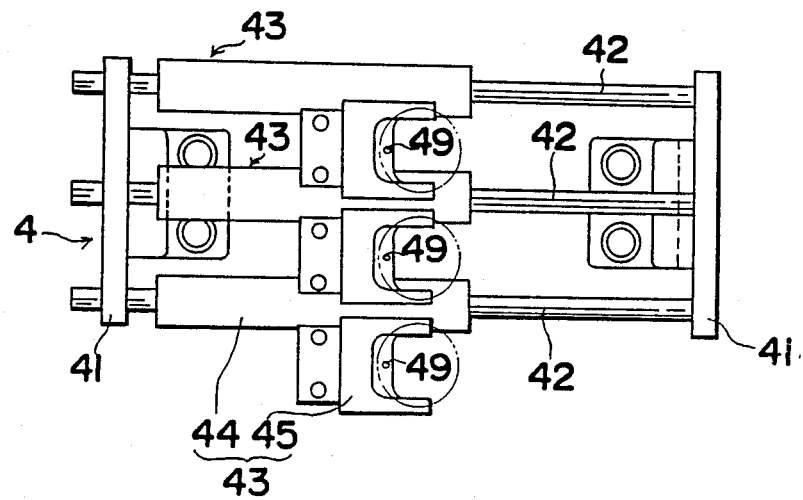
FIG. 2 is a top plan view of the mounting head exchange arrangement of FIG. 1.
Figure 3:
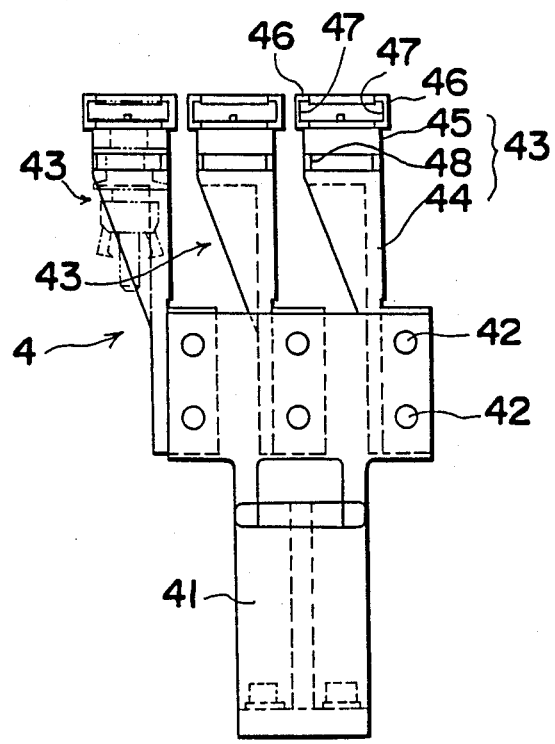
FIG. 3 is a side elevational view of the mounting head exchange arrangement of FIG. 1.
Figure 4:
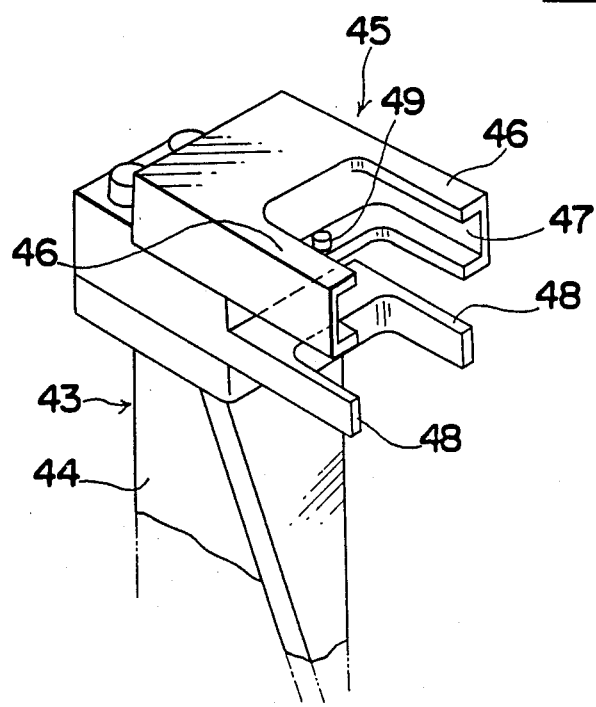
FIG. 4 is a fragmentary perspective view showing an essential portion of the mounting head exchange arrangement of FIG. 1, FIGS. 5 and 6 are views similar to FIG. 1 for explaining states of functioning thereof.

Before the description of the present invention proceeds, it is to be noted that like parts are designated by like reference numerals throughout the accompanying drawings.

Figure 14:
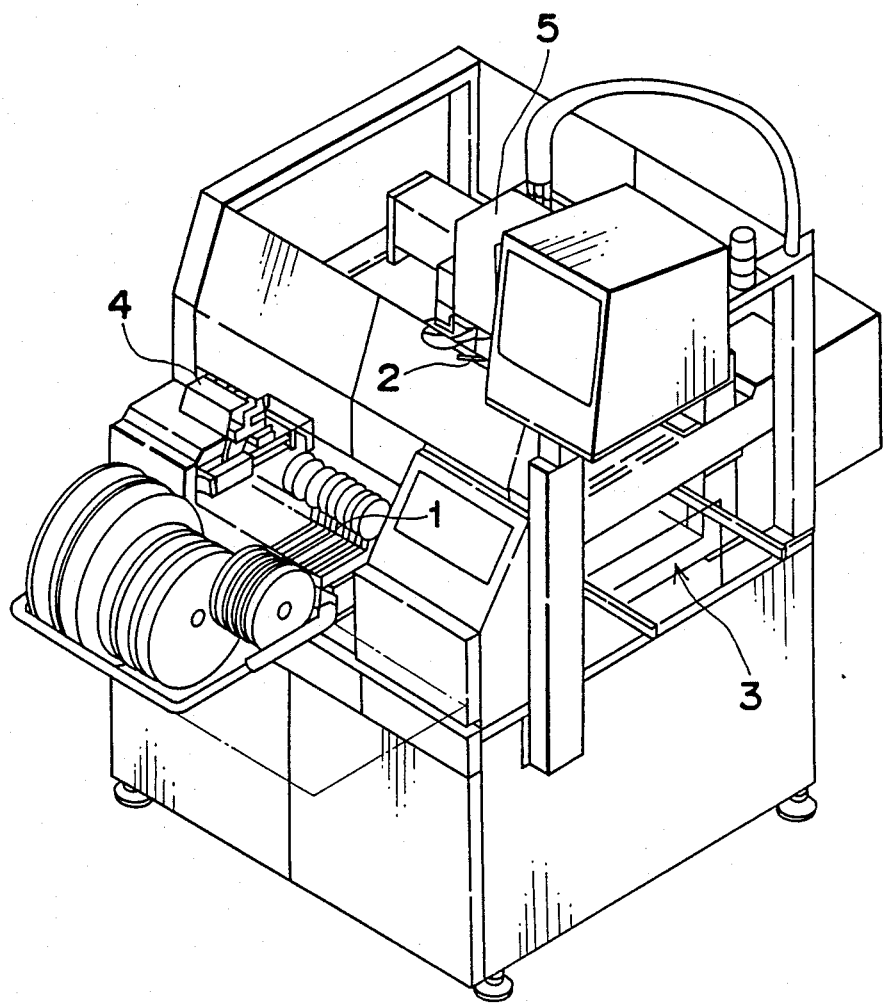
FIG. 14 is a perspective view showing a part mounting machine to which the mounting head exchange arrangement according to the present invention is applied.

Referring now to the drawings, there is shown in FIG. 14 a part mounting machine to which a mounting head exchange apparatus according to the present invention is applied. The part mounting machine generally includes a housing, a part supply portion 1 provided on a front tabular portion of the housing, a moving unit 5 as a part mounting portion to which a mounting head 2 is attached for displacement, a transfer device 3 for circuit boards, and an exchange arrangement 4 for the mounting heads directly related to the present invention. The mounting head 2 is attached to the moving unit 5 as the part mounting portion for mounting parts, through displacement in X-Y direction between a circuit board positioned at a predetermined position in a path from the part supply portion 1 to the transfer device 3 and the exchange arrangement 4.

Figure 9:
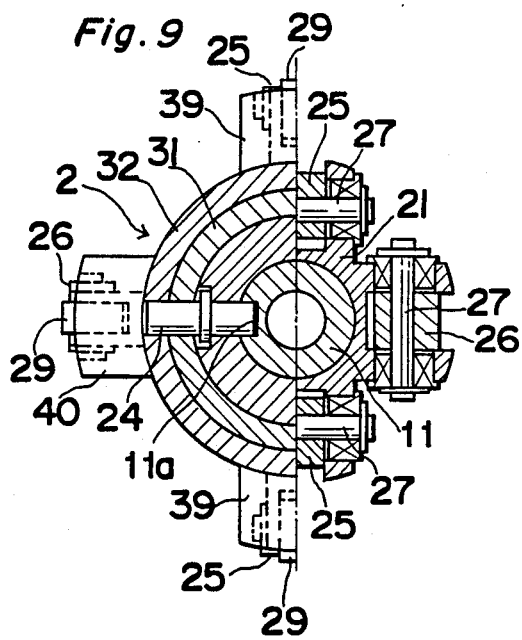
FIG. 9 is a cross section taken along the line IX—IX in FIG. 7, FIGS. 10 to 12 are side elevational views of the mounting head respectively showing states of functioning thereof.
Figure 10:
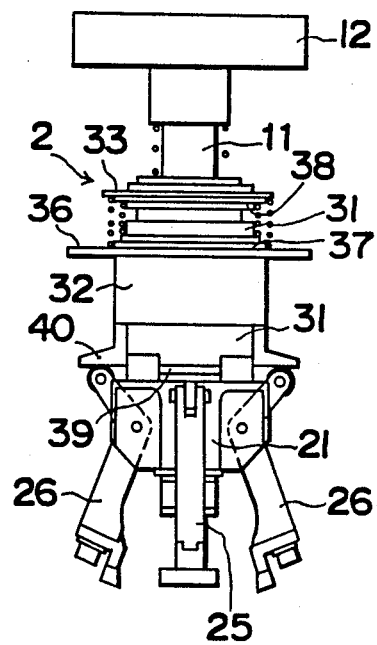
Figure 13:
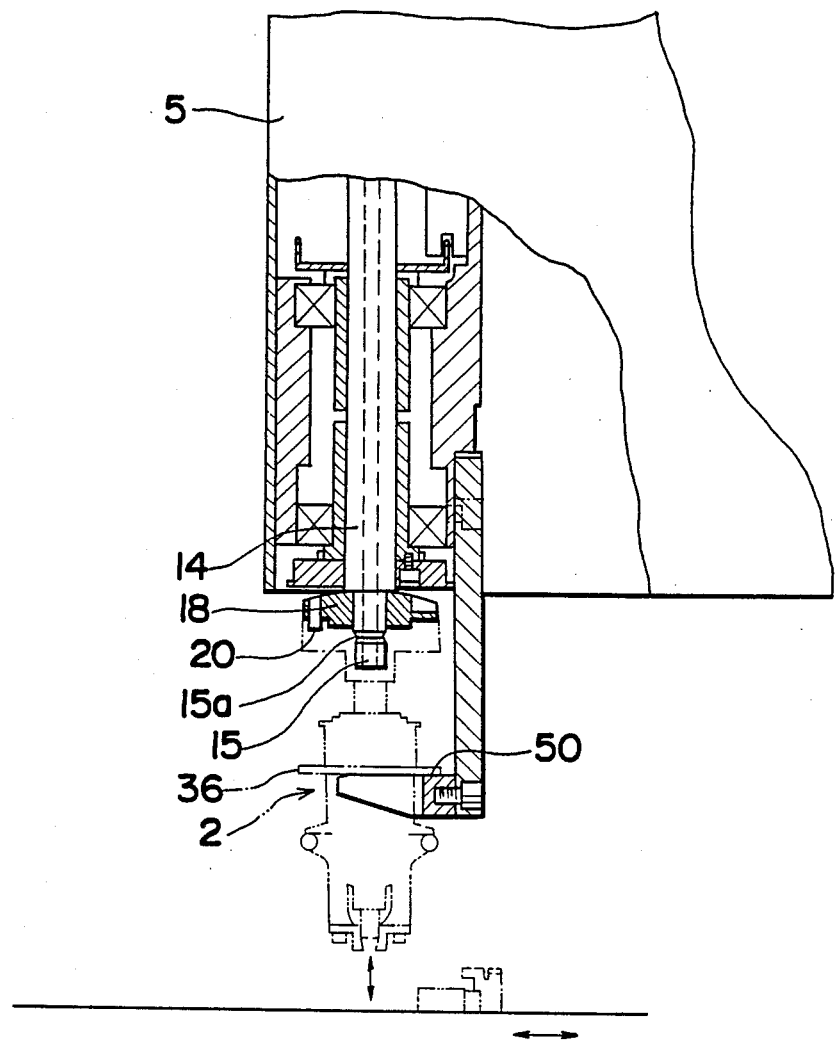
FIG. 13 is a fragmentary side elevational view, partly in section, showing construction of a moving unit.

Prior to the description of the mounting head exchange apparatus or arrangement 4, detailed constructions of the mounting head 2 will be explained with particular reference to FIGS. 7 to 9. The mounting head 2 includes a hollow shaft 11 formed with a support flange 12 at its upper end, and a suction nozzle 13 slidably received in the other end of the hollow shaft 11 so as to be normally urged to project outwardly from said other end. At the upper end of said hollow shaft 11, there is formed a fixing hole 16 which receives a fitting portion 15 formed at the lower end of the hollow support shaft 14 movably depending downwardly from the moving unit 5 as shown in FIG. 13. Meanwhile, the support flange 12 is provided with a stopper portion 17 resiliently projecting into the fixing hole 16 so as to be engaged with an engaging groove 15a formed on the fitting portion 15 referred to above. At the upper portion of the fitting portion 15 of the support shaft 14, an abutting plate 18 with a spigot joint to be abutted against the upper surface of the support flange 12 is fixed, while a rotation preventing pin 20 to be engaged with a pin hole 19 formed in the support flange 12 is provided to project from the abutting plate 18.

Over the hollow shaft 11, a support cylindrical member 21 is slidably fitted externally. This support cylindrical member 21 is prevented from falling off downwardly by a retaining ring 22 fitted around the lower end portion of the hollow shaft 11, and is also urged downwardly by a compression spring 23. At an intermediate portion of the above support cylindrical member 21, a guide pin 24 extending inwardly and outwardly through its peripheral wall is installed, with the inner end of the pin 24 being fitted in a guide groove 11a of the hollow shaft 11 for preventing rotation. Moreover, at the lower portion of this support cylindrical member 21, two pairs of position regulating claws 25 and 26 are pivotally connected for opening and closing by pins 27, and normally urged in the opening direction by springs 28 provided between said claws and the cylindrical member 21. Meanwhile, the upper portions of the position regulating claws 25 and 26 are extended outwardly slantwise, with rollers 29 being provided at upper ends thereof.

Over the outer peripheral surface of the support cylindrical member 21, a first sleeve 31 is slidably fitted, while a second sleeve 32 is further slidably fitted over the outer peripheral surface of said first sleeve 31. At the position above the claws 25 and 26, on the outer peripheral surface of the support cylindrical member 21, an annular flange 30a is provided to support the lower edges of the sleeves 31 and 32. A spring receiver 33 is engaged with a retaining ring 30b fitted on the upper end of the support cylindrical member 21, with compression springs 34 and 35 being provided between the spring receiver 33 and the respective sleeves 31 and 32. The outer end of the guide pin 24 referred to above is engaged with guide holes 31a and 32a formed in the sleeves 31 and 32 for prevention of rotation. A function flange 36 is formed to extend outwardly from the upper end outer periphery of the second sleeve 32. On the outer periphery in the vicinity of the upper end of the first sleeve 31, a retaining ring 37 which engages the upper end of the second sleeve 32 is fitted, with a proper gap being provided between the upper end of the second sleeve 32 and the retaining ring 37. Above the upper end of the first sleeve 31, a stopper 38 for this first sleeve 31 is disposed at the under surface of the spring receiver 33 with a proper gap therebetween. An engaging plate 39 for engaging the rollers 29 of the position regulating claws 25 is provided and extends outwardly in a diametrical direction from the lower edge of the first sleeve 31, while another engaging plate 40 for engaging the rollers 29 of the position, regulating claws 26 is similarly provided and extends outwardly in a diametrical direction from the lower edge of the second sleeve 32.

As shown in FIG. 13, the moving unit 5 is provided with a flange receiving member 50 for supporting the function flange 36 of the mounting head 2 from the lower portion. Meanwhile, the compression springs 35 and 34 for urging the second and first sleeves 32 and 31, and the spring 23 for urging the support cylindrical member 21 are designed to have smaller spring constants in that order, and when the support shaft 14 is displaced to project downwardly in the state where the function flange 36 is supported by a flange receiving member 50, the hollow shaft 11 and the support cylindrical member 21 are first lowered as one unit, and after the cylindrical member 21 is relatively displaced with respect to the second and first sleeves 32 and 31, the hollow shaft 11 is arranged to be lowered with respect to the support cylindrical member 21.

Referring particularly to FIGS. 1 to 4, details of the exchange arrangement 4 for exchanging the mounting heads with respect to the moving unit 5 will be described hereinafter.

As is seen in the drawings, three sets of upper and lower guide rods 42 are disposed in a parallel relation to each other between a pair of spaced confronting brackets 41. On the guide rods 42 for each pair, a holding member 43 is displaceably mounted. Each of the holding members 43 includes a movable member 44 displaceably supported by the guide rods 42 and the holding portion 45 for the mounting head 2, disposed at the upper portion of the movable member 44. In the top plan view, the holding portion 45 is formed generally in U-shape having a cut-out portion at one side in the direction of movement of the movable member 44 so as to provide opposed support pieces 46. As is most clearly seen in FIG. 4, holding grooves 47 are formed at the inner sides of the support pieces 46 so as to receive the outer peripheral portion of the support flange 12 of the mounting head 2, while a flange receiver 48 for receiving the function flange 36 of the mounting head 2 is provided below the support pieces 46. The flange receiver 48 is so disposed as to receive the function flange 36 in a state where compression reaction is applied between the support flange 12 and the function flange 36. Moreover, on the holding portion 45 at a portion intermediate between the support pieces 46, a positioning pin 49 for the mounting head 2 which engages a notched portion (not shown) formed on the outer periphery of the support flange 12 is disposed.

By the above construction, as shown in FIGS. 7 and 13, the mounting head 2 is held by the moving unit 5, with the fitting portion 15 formed at the lower end of the support shaft 14 for the moving unit 5 being fitted in the fixing hole 16 of the hollow shaft 11 for the mounting head 2, and also, with the function flange 36 being supported by the flange receiver 50.

Figure 11:
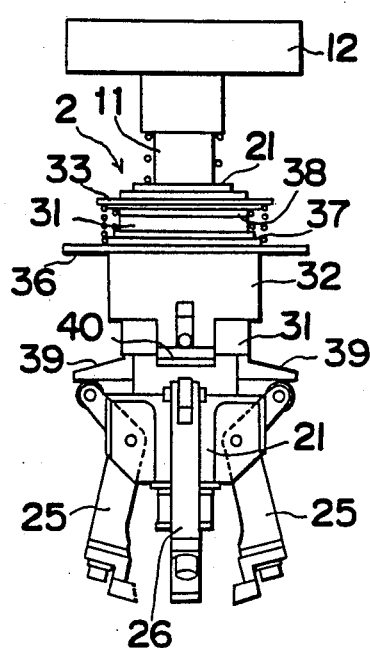
Figure 12:
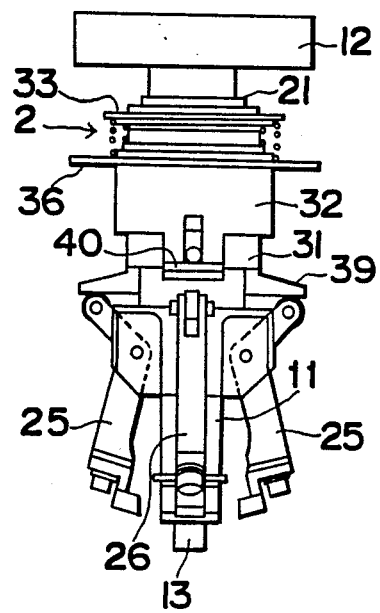

In the state as shown in FIGS. 7 and 8, the support shaft 14 is in the raised position, and the suction nozzle 13 has been retreated upwardly, with the support cylindrical member 21 being also located in the upper position, while the engaging plates 39 and 40 of the first and second sleeves 31 and 32 are in engagement with the rollers 29 of the respective position regulating claws 25 and 26, which are held in the closed state. When the support shaft 14 is displaced to project downwardly from the above state the hollow shaft 11, the support cylindrical member 21 and the first sleeve 31 are simultaneously moved downwardly, but the second sleeve 32 is relatively raised with respect to the support cylindrical member 21, since the function flange 36 is supported by the flange receiver 50, with consequent rising of the engaging plate 40 of the sleeve 32 to be spaced from the rollers 29 of the position regulating claws 26, and therefore, the position regulating claws 26 are to be opened by the urging force of the springs 28. Thereafter, upon further displacement of the support shaft 14, the upper end of the second sleeve 32 engages the retaining ring 37 of the first sleeve 31, and said first and second sleeves 31 and 32 are raised as one unit with respect to the support cylindrical member 21, whereby another pair of position regulating claws 25 are opened as shown in FIG. 11. Upon further projection of the support shaft 14 in the downward direction, the first and second sleeves 31 and 32 engage the stopper 38 at the upper end of the support cylindrical member 21, and thereafter, as shown in FIG. 12, the hollow shaft 11 is lowered, with the support cylindrical member 21 stopped, so that the suction nozzle 13 at the lower portion of the shaft 11 projects downwardly.

In the above state, when the support shaft 14 is raised after the part has been attracted by the suction nozzle 13, in the reverse order to the above function, only the hollow shaft 11 is first raised for retreatment of the suction nozzle 13, with subsequent rising of the support cylindrical member 21 also. Thus, in the first place, the rollers 29 of the claws 25 engage the engaging plate 39 of the first sleeve 31 to close said claws 25, and thereafter, the first sleeve 31 is also raised for the engagement of the rollers 29 of the claws 26 with the engaging plate 40 of the second sleeve 32, thereby to close said position regulating claws 26. Thus, subsequent to attraction of the part by the suction nozzle 13, positional regulation of the part is first effected in one direction by the first pair of the position regulating claws 25, and then, another positional regulation is effected in the other direction by the second pair of the position regulating claws 26. Therefore, positive positional regulations may be effected even if the part is attracted in an inclined posture.

Figure 5:
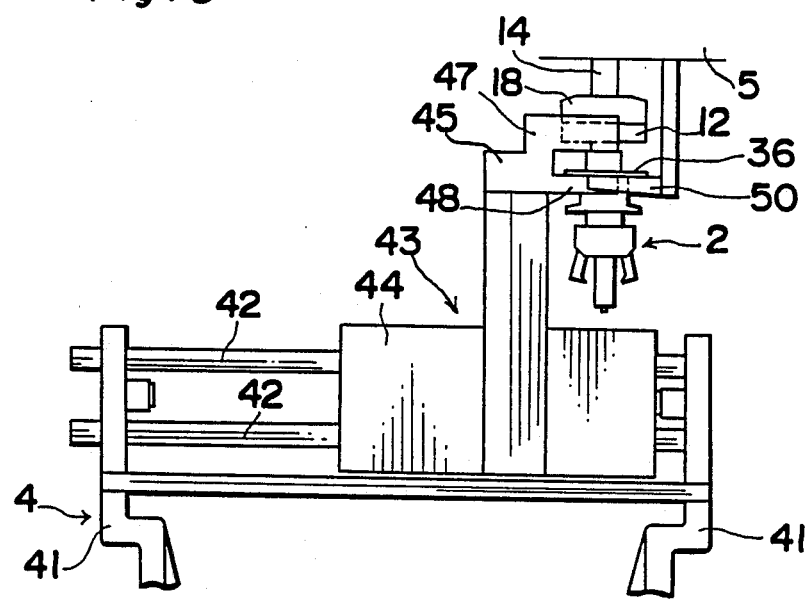

Meanwhile, in the case where it is required to exchange the mounting head 2 attached to the support shaft 14 of the moving unit 5, for a mounting head of other kinds, for example, owing to necessity for altering a diameter of the suction nozzle 13 due to change of the kind of parts to be attracted, the moving unit 5 is displaced up to the position of the exchange arrangement 4 as shown in FIG. 1 so as to position the mounting head 2 at the moving end of the holding member 43 having the empty holding portion 45, and the support shaft 14 is properly lowered to bring the support flange 12 to a height equal to that of the holding grooves 47. It is to be noted here that the flange receiving member 50 of the moving unit 5 and the flange receiver 48 of the holding portion 45 are set at the same height. Subsequently, as shown in FIG. 5, the holding member 43 is displaced toward the mounting head 2 so as to receive the support flange 12 in the holding grooves 47 for supporting, while the function flange 36 is received by the flange receiver 48. Thereafter, the support shaft 14 is raised to withdraw its fitting portion 15 out of the fixing hole 16 to hold the mounting head 2 by the holding member 43, and said holding member 43 is returned to the original position. Thus, the mounting head 2 is positively held at the holding portion 45 by the compression reaction acting between the support flange 12 and the function flange 36.

Figure 6:
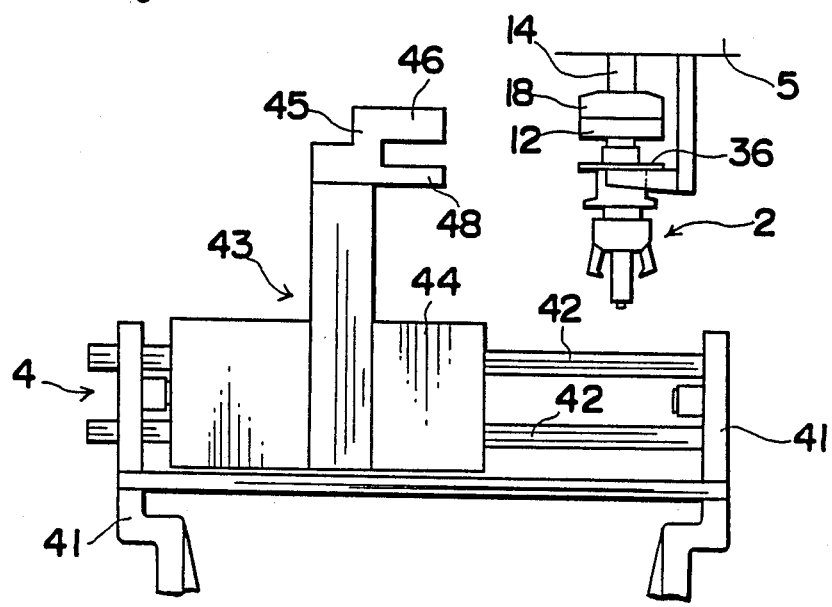

In the next step, after displacing the moving unit 5 to confront the holding member 43 holding the desired mounting head 2, the holding member 43 is moved to bring the mounting head 2 held thereby to a position immediately below the support shaft 14 as shown in FIG. 5, with the function flange 36 thereof being supported by the flange receiving member 50. Subsequently, the support shaft 14 is lowered to fit its fitting portion 15 into the fixing hole 16 for attaching the mounting head 2 to the moving unit 5. Then, as shown in FIG. 6, the empty holding member 43 is returned to the original position, thereby completing the exchange of the mounting heads.

It should be noted here that the present invention is not limited in its application, to the foregoing embodiment alone, but may be modified in various ways within the scope. For example, it may be so modified that, the flange receiving member 50 is arranged to be pivotable upwardly or downwardly between a horizontal posture and a stand-by attitude inclined downwardly, thereby to omit the flange receiver 48 at the side of the exchange arrangement 4. Similarly, it may be so arranged that the side of the moving unit 5 is relatively displaceable in the direction of insertion o withdrawal of the support flange 12 instead of moving the holding members 43 as in the foregoing embodiment.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A mounting head apparatus for a part mounting machine, said apparatus comprising:
   a moving unit;
   means on said moving unit for detachably securing a predetermined mounting head for mounting parts onto a substrate;
   a plurality of mounting head holding portions;
   a plurality of mounting heads detachably received in said plurality of mounting head holding portions;
   a suction nozzle on each one of said plurality of mounting heads for attracting parts;
   a plurality of position regulating claws on each one of said plurality of mounting heads for effecting positioning of parts attracted by each said suction nozzle; and
   means for selecting a predetermined one of said plurality of mounting heads from said plurality of mounting head holding portions and for detachably securing said selected one of said plurality of mounting heads to said mounting head securing means on said moving unit.

2. A mounting head apparatus for a part mounting machine, said apparatus comprising:
   a moving unit;
   a support shaft on said moving unit, and said support shaft having means for mounting part onto a substrate;
   a plurality of holding means, and each said holding means having a mounting head holding portion;

a plurality of mounting heads, each said mounting head having a support flange, and said support flanges each being slidably detachably mounted in said plurality of mounting head holding portions;

a suction nozzle on each one of said plurality of mounting heads for attracting parts;

a plurality of position regulating claws on each one of said plurality of mounting heads for effecting positioning of parts attracted by each said suction nozzle; and means for selecting a predetermined one of said plurality of mounting heads from said plurality of mounting head holding portions for detachably securing said selected one of said plurality of mounting heads to said mounting head securing means on said support shaft on said moving unit.

3. An apparatus as in claim 2, wherein said support shaft has first and second ends, and said first end of said support shaft has a fitting portion for engaging a predetermined one of said plurality of mounting heads.

4. An apparatus as in claim 3, wherein each one of said plurality of mounting heads has first and second ends, and said first end of each said mounting head has a fixing hole for detachably receiving said fitting portion of said support shaft.

5. An apparatus as in claim 2, wherein each of said plurality of holding means is substantially parallel to each other.

6. A mounting head apparatus for a part mounting machine, said apparatus comprising:

a moving unit;

means on said moving unit for detachably securing a predetermined mounting head for mounting parts onto a substrate;

a plurality of mounting head holding portions;

a plurality of mounting heads detachably received in said plurality of mounting head holding portions;

a support cylindrical member on each one of said plurality of mounting heads;

a movable hollow shaft axially displaceably inserted through each one of said support cylindrical members, said hollow shaft having first and second ends said first end including a suction nozzle for attracting part;

a first sleeve slidably fitted over the outer periphery of each said support cylindrical members;

a second sleeve slidably fitted over said first sleeve, and said second sleeve having means for engaging said first sleeve after said second sleeve has slid a predetermined amount for then moving said first and second sleeves simultaneously; and two sets of at least two position regulating claws for effecting positioning of parts attracted by each said suction nozzle, each said position regulating claw being movably attached to said support cylindrical member, and said sets of position regulating claws being opened and closed for positioning a part by said second sleeve initial sliding a predetermined amount for engaging said first sleeve for then sliding said first and second sleeves simultaneously for opening and closing said sets of position regulating claws.

7. A mounting head apparatus for a part mounting machine, said apparatus comprising:

a moving unit;

a support shaft on said moving unit, and said support shaft having means for detachably securing a predetermined mounting head for mounting parts onto a substrate;

a plurality of holding means, and each said holding means having a mounting head holding portion;

a plurality of mounting head, each said mounting head having a support flange, and said support flanges each being slidably detachably mounted in said plurality of mounting head holding portions;

a suction nozzle on each one of said plurality of mounting heads for attaching parts;

a support cylindrical member on each one of said plurality of mounting heads;

a movable hollow shaft axially displaceably inserted through each one of said support cylindrical member, said hollow shaft having first and second ends, said first end including a suction nozzle for attracting parts;

a first sleeve slidably fitted over the outer periphery of each said support cylindrical members;

a second sleeve slidably fitted over said first sleeve, and said second sleeve having means for engaging said first sleeve after said second sleeve has slid a predetermined amount for then moving said first and second sleeves simultaneously;

two sets of at least two position regulating claws for effecting positioning of parts attracted by each said suction nozzle, each said position regulating claw being movably attached to said support cylindrical member, and said sets of position regulating claws being opened and closed for positioning a part by said second sleeve sliding initially a predetermined amount for engaging said first sleeve for then sliding said first and second sleeves simultaneously for opening and closing said sets of position regulating claws; and means for selecting a predetermined one of said plurality of mounting heads from said plurality of mounting head holding portions for detachably securing said selected one of said plurality of mounting heads to said mounting head securing each on said support shaft on said moving unit.

8. An apparatus as in Claim 7, further comprising means for moving said plurality of holding means adjacent to said moving unit 9. A mounting head apparatus for a part mounting machine, said apparatus comprising:

a moving unit;

a support shaft on said moving unit, said support shaft having means for detachably securing a predetermined mounting head for mounting parts onto a substrate;

a plurality of holding means, and each said holding means having a mounting head holding portion;

a plurality of mounting heads, each said mounting head having a support flange, and said support flanges each being slidably detachably mounted in said plurality of mounting head holding portions;

a suction nozzle on each one of said plurality of mounting heads for attracting parts;

a plurality of position regulating claws on each one of said plurality of mounting heads for effecting positioning of parts attracted by each said suction nozzle;

a function flange means on each one of said plurality of mounting heads, said function flange means being axially and resiliently displaceable on said mounting head, said function flange means having means for selectively opening and closing said position regulating claws for effecting positioning of part attracted by each said suction nozzle;

means on each said holding portion for releasably supporting one of said support flanges and one of said function flange means for applying a compression reaction between said support flange and said function flange means for positively holding said mounting heads in said mounting head holding portions; and means for selecting a predetermined one of said plurality of mounting heads from said plurality of mounting head holding portions for detachably securing said selected one of said plurality of mounting heads to said mounting head securing means on said moving unit.

10. An apparatus as in claim 9, wherein said support shaft has first and second ends, and said first end of said support shaft has a fitting portion for engaging a predetermined one of said plurality of mounting heads.

11. An apparatus as in claim 10, wherein each one of said plurality of mounting heads has first and second ends, and said first end of each said mounting head has a fixing hole for detachably receiving said fitting portion of said support shaft.

12. An apparatus as in claim 9, wherein each of said plurality of holding means is substantially parallel to each other.

13. An apparatus as in claim 9, wherein said function flange means includes a support cylindrical member on each one of said plurality of mounting heads, a movable hollow shaft axially displaceably inserted through each one of said support cylindrical members, said hollow shaft having first and second ends, said first end including a suction nozzle for attracting parts, a first sleeve slidably fitted over the outer periphery of each said support cylindrical members, and a second sleeve slidably fitted over said first sleeve, and said second sleeve having means for engaging said first sleeve after said second sleeve has slid a predetermined amount for then moving said first and second sleeves simultaneously, and said plurality of position regulating claws includes two sets of at least two position regulating claws for effecting positioning of parts attracted by each said suction nozzle, each said position regulating claw being movable attached to said support cylindrical member, and said set of position regulating claws being opened and closed for positioning a part by said second initially sliding a predetermined amount for engaging said first sleeve for then sliding said first and second sleeves simultaneously for opening and closing said sets of position regulating claws.

* * * * *